United States Patent
Chen

(10) Patent No.: US 7,525,849 B2
(45) Date of Patent: Apr. 28, 2009

(54) FLASH MEMORY WITH SEQUENTIAL PROGRAMMING

(75) Inventor: Chung-Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 320 days.

(21) Appl. No.: 11/674,215

(22) Filed: Feb. 13, 2007

(65) Prior Publication Data

US 2008/0192545 A1   Aug. 14, 2008

(51) Int. Cl.
*G11C 7/10* (2006.01)
(52) U.S. Cl. .............................. 365/189.04; 365/233.1; 365/189.011
(58) Field of Classification Search ............ 365/189.04, 365/233.1, 189.011
See application file for complete search history.

(56) References Cited

U.S. PATENT DOCUMENTS

| | | | |
|---|---|---|---|
| 5,537,350 A * | 7/1996 | Larsen et al. ......... 365/185.33 |
| 5,576,991 A | 11/1996 | Radjy et al. |
| 5,642,311 A | 6/1997 | Cleveland et al. |
| 5,706,240 A | 1/1998 | Fiocchi et al. |
| 5,790,466 A | 8/1998 | Hotta |
| 5,822,252 A | 10/1998 | Lee et al. |
| 6,023,426 A | 2/2000 | Tang et al. |
| 6,046,932 A | 4/2000 | Bill et al. |
| 6,751,158 B2 | 6/2004 | Ryoo |
| 7,009,882 B2 | 3/2006 | Chen |
| 7,023,734 B2 | 4/2006 | Chen |
| 2005/0226051 A1 | 10/2005 | Bedarida et al. |

* cited by examiner

*Primary Examiner*—Son Dinh
*Assistant Examiner*—Nam Nguyen
(74) *Attorney, Agent, or Firm*—Duane Morris LLP

(57) ABSTRACT

A method of programming a group of memory cells in a semiconductor memory device selecting a group of memory cells for programming, and enabling a first subgroup of memory cells from the group of memory cells for programming. After enabling the first subgroup, the programming method waits a first predetermined time period and after the first predetermined time period, enables a second subgroup of memory cells from the group of memory cells for programming while continuing to enable the first subgroup for programming.

22 Claims, 7 Drawing Sheets

FLASH MEMORY WITH SEQUENTIAL PROGRAMMING

FIELD OF THE INVENTION

The present invention relates to memory devices and more specifically to flash memory devices and methods of programming the same.

BACKGROUND OF THE INVENTION

FIG. 1 shows a typical configuration for an integrated circuit including a flash EEPROM (electrically erasable and programmable ROM) memory array 100 and circuitry enabling programming, erasing, reading, and overerase correction for memory cells in the array 100. The flash EEPROM array 100 is composed of individual flash memory cells, such as cell 102. Each cell 102 has a drain connected to a bit line, such as bit line 104, each bit line being connected to a bit line switch circuit 106 and column decoder 108. Sources of the array cells are connected to each other and VSL, which is the common source signal, while their gates are each connected by a word line to a row decoder 110.

The row decoder 110 receives voltage signals from a power supply 112 and distributes the particular voltage signals to the word lines as controlled by a row address received from a processor or state machine 114. Likewise, the bit line switch circuit 106 receives voltage signals from the power supply 112 and distributes the particular voltage signals to the bit lines as controlled by a signal from the processor 114. Voltages provided by the power supply 112 are controlled by signals received from processor 114.

The column decoder 108 provides signals from particular bit lines to sense amplifiers or comparators 116 as controlled by a column address signal received from processor 114. The power supply 112 supplies voltages to column decoder 108 and bit lines 104. Power supply 112 may include a charge pump circuit or external power supply to supply the bit line current on a bit line needed during programming or overerase correction.

The sense amplifiers 116 receive a signal from reference cells of reference array 118. With signals from the column decoder 108 and reference array 118, the sense amplifiers 116 then each provide a signal indicating a state of a bit line relative to a reference cell line to which it is connected through data latches or buffers 120 to processor 114.

To program a cell in the flash memory array 100, high gate-to-source voltage pulses are provided to the cell from power supply 112 while a source of the cell is grounded. For instance, during programming multiple gate voltage pulses typically of 9-10 V are each applied for approximately three to six microseconds to a cell, while a drain voltage of the cell is set to 4-4.5 V and its source is grounded. This bias from-drain to-source generates hot electrons near the drain side. The large gate-to-source voltage pulses enable a probability of hot electrons to overcome an energy barrier between the channel and floating gate formed by a thin dielectric layer, thereby driving hot electrons onto the floating gate of the cell. This programming procedure, termed "hot electron injection," results in an increase of a threshold voltage for the cell, the threshold being the gate-to-source voltage required for the cell to conduct.

The entire program operation is repeatedly performed for all of the memory cells in a pre-selected unit, for example for the memory cells in a word unit (i.e., 16 bits). More specifically, program and the program-verify steps are first performed for all corresponding memory cells included in the word unit. Next, it is determined whether failed memory cells exist within the word unit. If it is determined that failed cells exist, the program step and the program-verify step are performed for the failed cells. These processes are performed until failed memory cells do not exist.

As mentioned above, channel hot carrier injection is used to write (program) a "0" data into a respective flash cell, such as a NOR type cell with a floating gate. A word mode programming operation is usually used to program sixteen cells at a time. In 0.18 µm generations, the typical programming condition is as follows: control gate —9V, drain node —4.5V, source node —0V, and bulk node —0V. The typical cell current during programming is 0.2 mA. Therefore, the sixteen cells will consume 3.2 mA of current if simultaneously programmed. This programming current is provided from the power supply 112, which typically includes a pumping circuit for providing the regulated bit line voltage for programming the cell. The internal pumping circuit typically has an efficiency of about 15%, meaning the consumed power supply current is 21 mA (i.e., 3.2 mA/0.15). In other words, the power supply consumes more current to supply the cell programming current, since the cell drain node has a higher voltage level (4-4.5V) than the power supply (2.7-3.3V).

This large programming current may create power noise. That is, the power supply is connected to each transistor in the memory chip through metal lines having resistance. Therefore, there is a voltage drop due to the large current flowing across these connection lines leading to power noise. Also, there is a specified upper limit to the power supply current defined for the memory device. This large current can approach or exceed that current. Further, tester units for testing memory devices have upper limits for power supply output current. A tester can test multiple chips at the same time. Therefore, high current consumption by chips limits the number of chips that can be tested at one time by the tester.

Still further, bit line leakage current is present once cells are over-erased. This leakage current can increase when the bit line is at a high voltage level compared to the reading condition. This bit line leakage current can cause the regulated voltage to drop below the voltage level necessary for programming.

Therefore, there remains a need for a semiconductor memory device with improved programming capabilities and efficiencies and a method of programming the same.

SUMMARY OF THE INVENTION

A method of programming a group of memory cells in a semiconductor memory device is provided. The device includes a memory array including a plurality of memory cells coupled to a plurality of addressable word lines and a plurality of addressable bit lines, wherein the bit lines are selectively coupled to a common voltage node for being biased by a bit line programming voltage. The method includes the steps of selecting the group of memory cells for programming, and enabling a first subgroup of memory cells from the group of memory cells for programming. After enabling the first subgroup, waiting a first predetermined time period and after the first predetermined time period, enabling a second subgroup of memory cells from the group of memory cells for programming while continuing to enable the first subgroup for programming.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
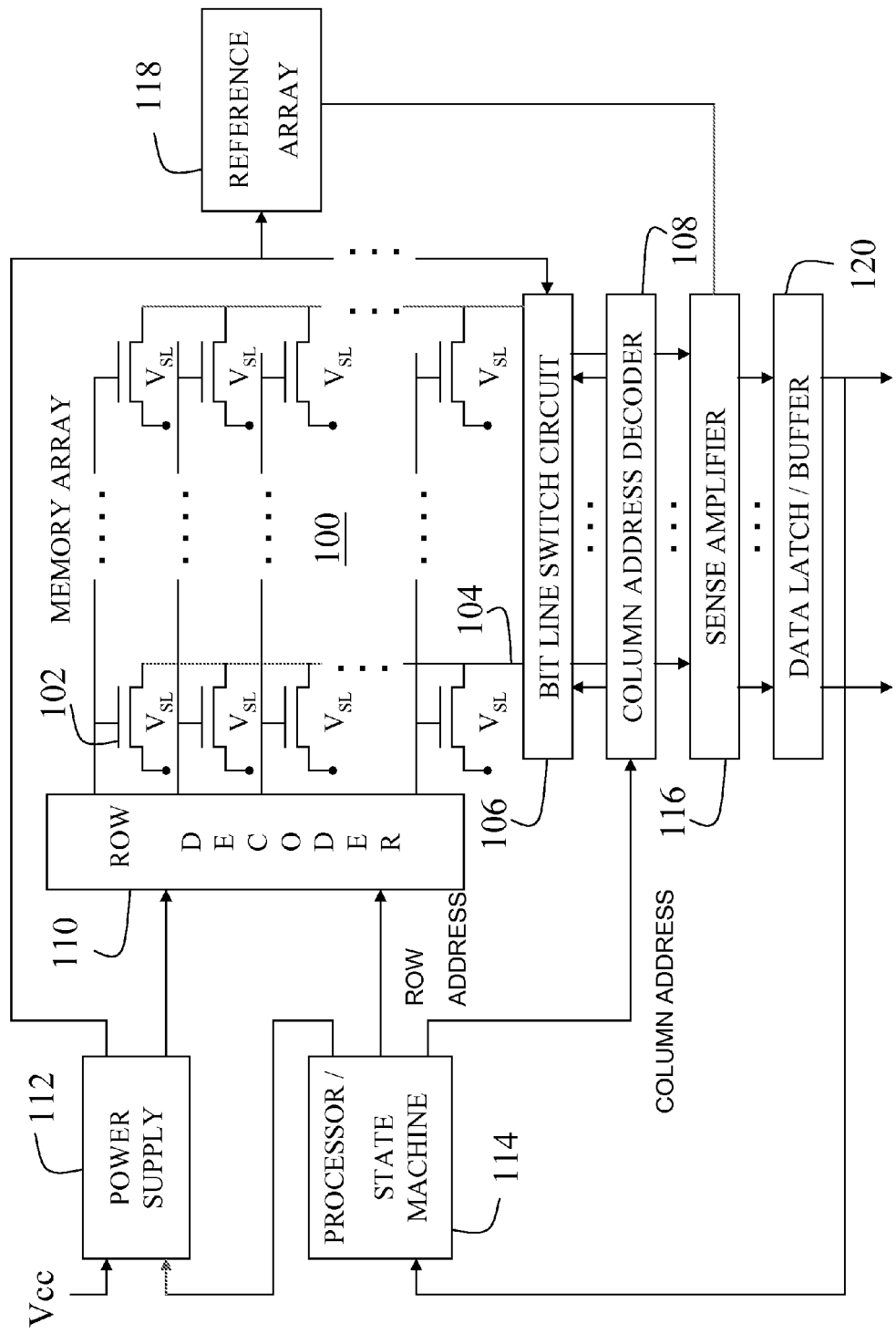
FIG. 1 is shows a typical prior art configuration for an integrated circuit including a flash EEPROM memory array and circuitry enabling programming, erasing, reading and overerase correction in the array.
Figure 2:
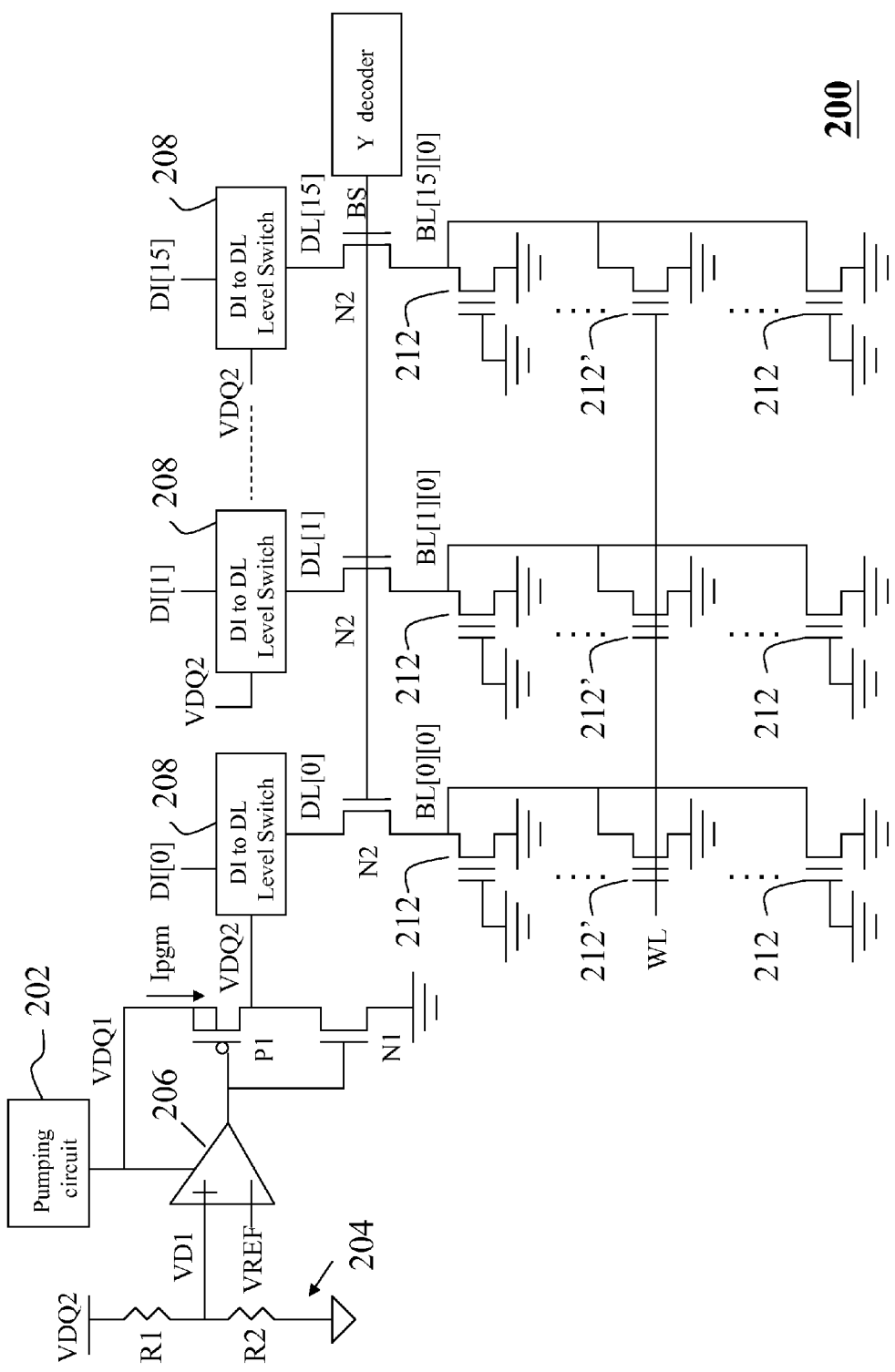
FIG. 2 is a circuit diagram of a prior art programming circuit portion of a semiconductor memory device.

FIG. 2 is a circuit diagram of a prior art programming circuit 200 for programming memory cells of a semiconductor memory device, such as the flash memory device of FIG. 1 including an array of NOR memory cells, hereinafter sometimes referred to as a "flash memory device." Those features of the flash memory device not described herein are known to those of ordinary skill in the art and need not be repeated herein. Commonly assigned U.S. Pat. No. 7,009,882 provides a detailed discussion of the flash memory device structure, the entirety of which is hereby incorporated by reference herein.

The programming device 200 includes a power supply, such as charge pump circuit 202, that provides voltage value VDQ1. Various structures for charge pump circuit 202 are known in the art. Generally, charge pumps use capacitors as energy storage elements and some form of switching device to control connection of voltages to the capacitor. The pump circuit may also include an output capacitor for smoothing the output voltage. Higher loads result in lower average voltages, so the voltage can vary. A voltage regulator circuit is coupled to the output of the pump circuit 202. As is known in the art, the voltage regulator circuit includes a resistive voltage divider 204, comparator 206, PMOS P1 and NMOS N1. Regulated voltage VDQ2 is provided at the drain nodes of transistors P1 and N1. Even though the voltage is regulated, it is load dependent and thus can dip below its target voltage. If the maximum supplied current of the pump is not enough, the regulation function of the regulator will "fail" and the VDQ2 voltage will drop to below the regulation target voltage until the current drawn by the cell array equals the maximum supplied current of the pump. The programming current is labeled "$I_{pgm}$" in FIG. 2.

The supply voltage VDQ1 is regulated to a target drain voltage value VDQ2 by comparator 206. Normally VDQ1 is higher than the regulated target of VDQ2 because VDQ1 is the supply source for VDQ2. The regulated target voltage is determined by the ratio of R1 and R2, as well as the value of bandgap reference voltage VREF. The target value for voltage VDQ2 is set to $((R2+R1)/R2)*VREF$. VREF is a reference voltage provided by, for example, a bandgap reference voltage sub-circuit (not shown). The reference voltage VREF is set to about 1.25V and the regulated target voltage VDQ2 is set based upon the program characteristics of the flash cells, which is determined by the drain voltage needed for programming the flash cells taking into consideration any voltage drops due to bit line switches N2 on the bit lines. In one example, VDQ2 is between about 4.0-4.5 V.

Comparator 206 along with MOSs P1 and N1 can be viewed as an operational amplifier. P1 is controlled by the output of comparator 206 to draw charge from VDQ1 when VDQ2 is lower than regulation target. N1 is used to leak charge from VDQ2 if VDQ2 is higher than the regulation target.

A capacitor (not shown) can be coupled between node VDQ2 and ground. This capacitor reduces the variation in VDQ2 when its source, VDQ1, is pumped. A leakage path circuit (not shown) familiar to those in the art may also be provided.

The programming circuit 200 also includes a plurality of DI (data in) to DL (data line) Level Switches 208, which pass the voltage level VDQ2 and programming current to corresponding data lines DL[0:n], which are coupled through corresponding NMOS switches N2 to bit lines BL[0:n][0:i]. Switches N2 are controlled by Y decoder 210 for selecting bit lines BL. Flash cells 212 are coupled in an array to the bit lines BL and to corresponding word lines WL. Non-selected word lines are shown grounded. The selected word line, shown as WL, is coupled to a word line voltage (e.g., 9-10V) for programming. The cells associated with the selected word line are identified as 212'.

Each bit line BL is coupled to the drain terminal of a plurality of flash cells 212. Each cell 212 has its respective gate terminal coupled to a respective word line WL[0:x]. It should be understood that any number of bit lines and words lines, and thus any number of cells, may be included in a memory array. Multiple bit lines are selected by the Y-decoder 210, which controls bit line switches N2 corresponding to each bit line BL. Y-decoder 210 can be included in column address decoder 108 from FIG. 1. Once a corresponding bit switch N2 is turned on, the corresponding bit line is activated (i.e., coupled to the respective DI to DL Level Switch 208 to receive data DI) and individual cells 212' are selected for programming via the word line signals WL.

As those of ordinary skill in the art will recognize, the memory array typically includes multiple I/Os, such as 16 I/Os in word mode. Each I/O, in turn, includes multiple bit lines BL. Each I/O corresponds to one internal data line signal, DL (shown as DL[0] through DL[15]), and multiple bit lines (though each data line DL is shown coupled to only one bit line BL (labeled BL[n][0]) so as to not unnecessarily obscure the illustrated design). So, for example, data line DL[0] of I/O[0] may be associated with sixteen bit lines BL[0][0:15]. One bit line is selected from each I/O for reading or programming, i.e., one bit line each is selected from 16 I/Os in word mode (for a total of 16 bit lines and 16 bits) for reading or programming. Therefore, signal DL[n] is a global signal shared by many local bit lines with a common I/O[n].

DI to DL Level Switches 208 store the programming data DI and pass the VDQ2 voltage to the selected bit line if a "0" is to be programmed or outputs a second voltage (e.g., ground) if a "1" is to be programmed. DI[0:15] represents the data input signal bus which shows which bits should be programmed. DL[0:15], which is controlled by DI[0:15], represents the bus path for passing the needed drain current and voltage to the bit lines selected by the Y-decoder 210. Y-decoder decodes the bit select signal BS to turn on bit switches N2. The BS signal is a high voltage signal that turns on switches N2 to pass the voltage from the DI to DL Level Switches 208. Bits that are to be programmed are initially in erased state but switch to the programmed state during the program operation.

Figure 3:
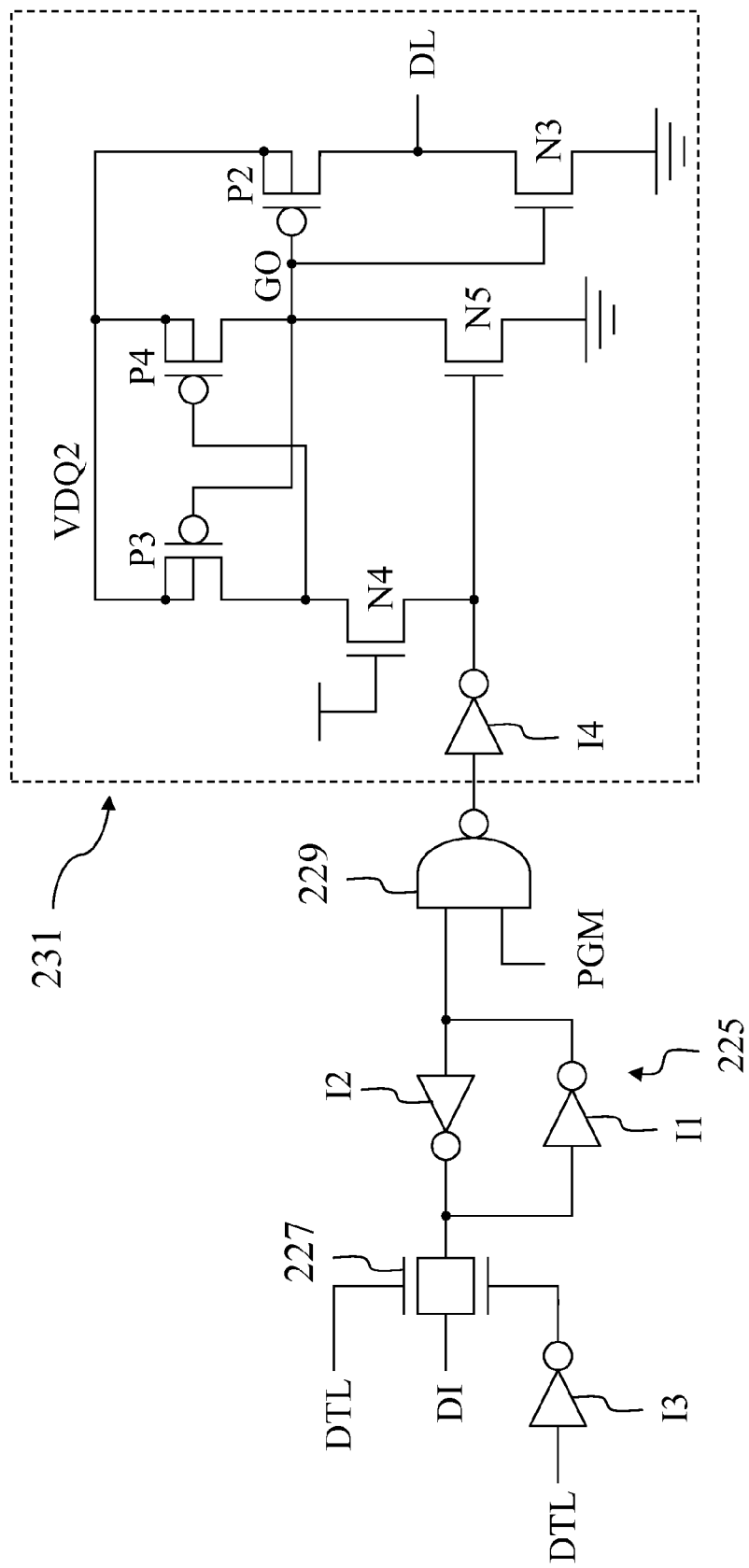
FIG. 3 is a circuit diagram of the data level switch portion of the prior art programming circuit of FIG. 2.

FIG. 3 is a more detailed circuit diagram of the DI to DL level switch 208 of FIG. 2. The level switch circuit receives a data signal from data input line DI at its input and passes that signal to a data latch 225 comprising inverters I1 and I2. The data from data input DI is passed to the data latch 225 through a CMOS pass gates 227, which include PMOS and NMOS transistors coupled in parallel, with a first terminal of each coupled together to the data latch 227 and a second terminal of each coupled together to the data input line DI. The gate terminal of the NMOS receives signal DTL and the gate terminal of the PMOS is coupled to /DTL, via inverter I3. Collectively, the transistors of the CMOS pass gate 227 serve as a switch that passes signal DI when DTL is high. DTL is a pulse signal to latch the DI to the latch 225. If input data is latched by the rising edge of the external write control signal, XWEN, DTL will be generated at the rising edge of XWEN. The data DI is thereby stored by latch 225.

The programming circuit 208 also includes NAND gate 229 coupled to an output of the data latch 225 and to an input of a level shifter 231. The level shifter 231 includes inverter I4, PMOSs P3, P4, and NMOSs N4, N5 as connected in FIG. 3. Signal GO is the output signal of the level shifter 231. The level shifter shifts the output of NAND gate 229 from Vcc to VDQ2. An output buffer, specifically and inverter including PMOS P2 and NMOS N3, is coupled to receive control signal GO. When control signal GO is high, the data line DL is set to ground. When signal GO is low, the data line DL is set to voltage VDQ2.

When programming is started, program control signal PGM goes high. If the programmed datum latched by data latch 225 is a "0", the output of NAND 229 is a "0". The output of inverter I4 is a "1", turning N5 on and setting GO to ground. With GO set low, PMOS P2 is turned on to pass VDQ2 to DL. If the programming datum is a "1", the output of NAND 229 is a "1." The output of inverter I4 is a "1." Transistor N5 is off, setting signal GO high. When GO is high, the PMOS P2 is turned off and the NMOS N3 is turned on to pull DL to 0V. When the input signal (the output of NAND gate 229) is logic low, the NMOS transistor N5 is "on" via an inverter I4. As a result, the NMOS transistor N5 electrically drives the output GO to ground. Further, the logic low output signal turns "on" the PMOS transistor P3 which provides the supply voltage VDQ2 to a gate of the PMOS transistor P4, thereby holding the PMOS transistor P4 "off". When the input signal goes high, the NMOS transistor N5 is turned "off". The NMOS transistor N4 electrically connects the gate of the PMOS transistor P4 to an inverted input signal at logic low (i.e., ground). Hence, the PMOS transistor P4 is turned "on" and provides the supply voltage VDQ2 to the output GO.

The programming circuit of illustrated in FIGS. 2-3, and thus the programming operations implemented thereby, consumes high power supply current when multiple cells are selected for programming during a given programming operation. This, in turn, stresses the capabilities of the pump circuit. The regulated voltage can drop below the required programming voltage, leading to failed programming operations and the need to reprogram cells.

Figure 4:
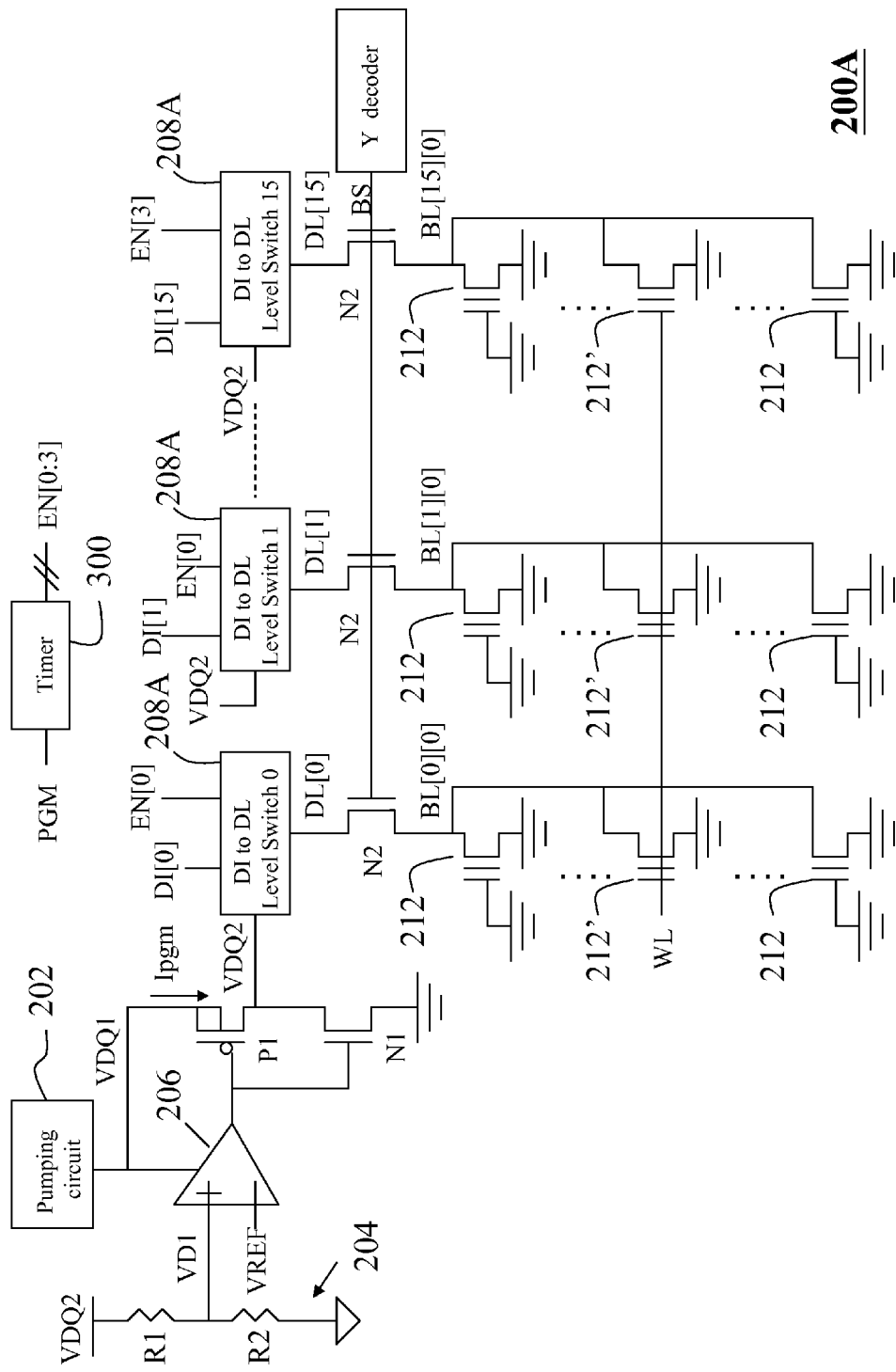
FIG. 4 is a circuit diagram of a programming circuit portion of a semiconductor memory device according to one embodiment of the present invention.

FIG. 4 is circuit diagram of a programming circuit 200A according to an embodiment of the present invention for use in connection with a semiconductor memory device, such as the flash memory device of FIG. 1. In embodiments, the programming circuit 200A is identical to that of the programming circuit 200 of FIG. 2, and like reference numbers are used to identify like components, except for modifications which are identified by reference numbers having the suffix "A." A control circuit 300 is also provided.

In addition to the regulated power supply (e.g., pumping circuit 202 and voltage regulator), Y-decoder 210, bit switches N2 and memory cells 212, 212' described above, the programming circuit 200A includes modified DI to DL Level Switches 208A. These level switches 208A are identical to level switches 208 of FIG. 2 except that they are also responsive to an enable control signal EN. More specifically, assume there are sixteen I/O in the memory device, meaning programming occurs in word units as described above. In the present invention, the I/Os are broken into subgroups for sequential programming, such as subgroups each corresponding to bytes (8 I/Os), half-bytes (4 I/Os), quarter-bytes (2 I/Os) or individual I/Os (1 memory I/O) as described in more detail below.

Half-byte subgroups are preferred and illustrated in FIG. 4. The word unit is split into four-subgroups with each subgroup associated with a respective enable control signal from EN[0:3]. In this example, DI to DL Level Switches[0:3] are controlled by EN[0], DI to DL Level Switches[4:7] are controlled by EN[1], DI to DL Level Switches[8:11] are controlled by EN[2], and DI to DL Level Switches[12:15] are controlled by EN[3].

Enable control signal EN[0:3] is provided by control circuit 300. In one embodiment, the control circuit 300 includes a timer or other device for sequentially issuing control signals EN[0], EN[1], EN[2] and EN[3] for enabling and disabling the subgroups of DI to DL Level Switches 208A, and thus enabling and disabling subgroups of memory cells for programming operation.

Figure 6:
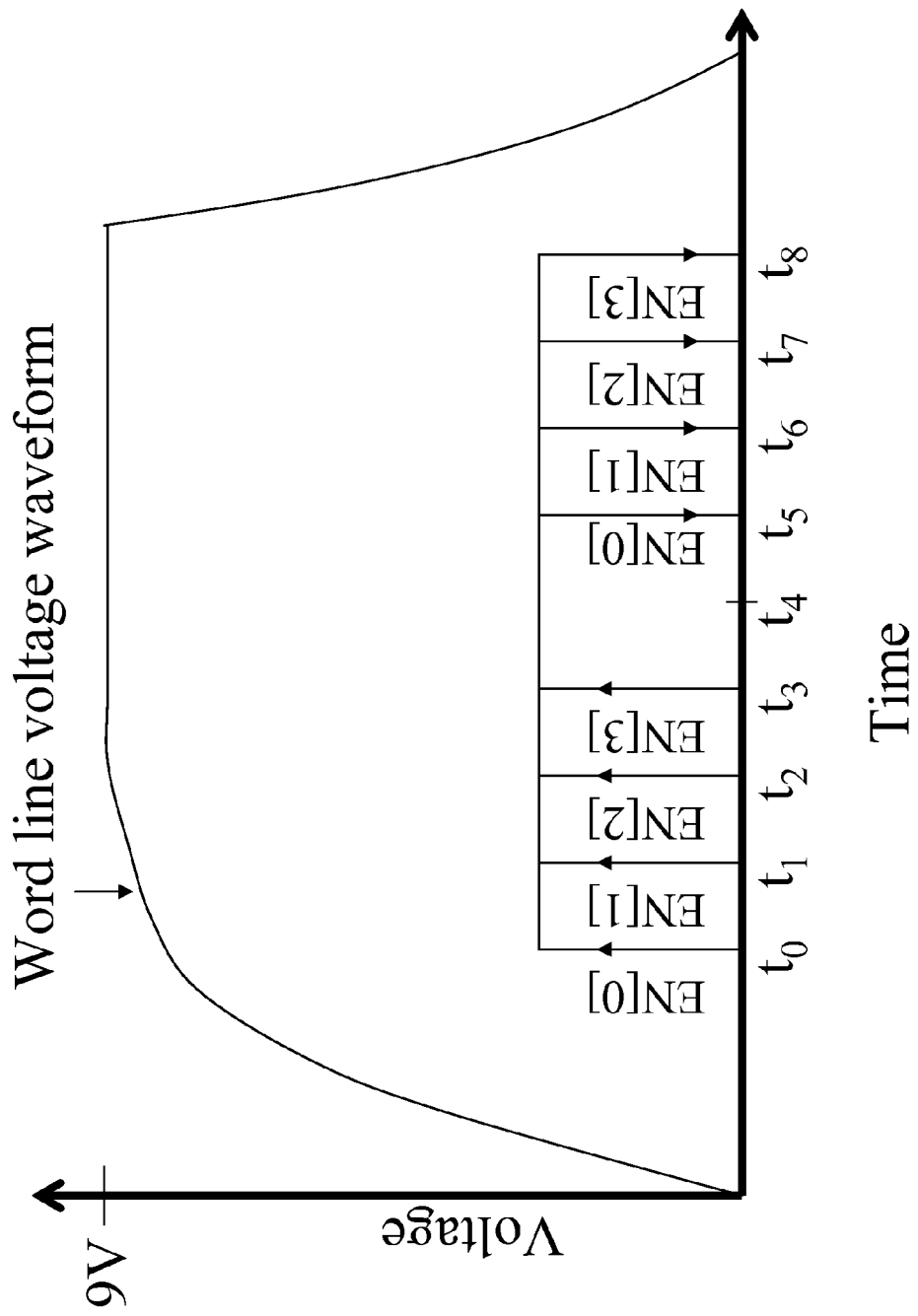
FIG. 6 is a timing diagram illustrating one embodiment of sequential programming operation of the circuits of FIGS. 4 and 5.

FIG. 6 is a timing diagram illustrating the operation of the control circuit 300. Assume for example that each time unit (e.g., the time between time t0 and t1) is 1 μs and that about 5 μs is sufficient for programming of a cell. When a program control signal PGM is issued to begin the programming operation, the word line voltage on the selected word line WL goes high. When the program operation ends, and PGM goes low, the word line voltage goes low. At time t0, EN[0] goes high. A high EN[0] in connection with a high program control signal PGM enables DI to DL Level Switches[0:3], allowing programming of memory cells connected to BL[0:3][i], as selected by the Y-decoder 210, with data DI[0:3]. DI to DL Level Switches [4:15] remain disabled. The enable signal EN[0] remains high for a predetermined time period sufficient to allow programming (e.g., for 5 μs) and then goes low (in this example, at time t5). Control circuit 300 waits a predetermined time period, for example 1 μs, before setting enable control signal EN[1] high at time t1. A high EN[1] in connection with a high program control signal PGM enables DI to DL Level Switches[4:7], allowing programming of memory cells connected to BL[4:7][i] as selected by the Y-decoder 210 with data DI[4:7]. DI to DL Level Switches [8:15] remain disabled. The enable signal EN[1] remains high for predetermined time period sufficient to allow programming (e.g., 5 μs) then goes low at time t6. For an overlapping period of time, i.e., from time t1 until time t5, both EN[0] and EN[1] are high.

As shown in FIG. 6, the control circuit 300 sequentially enables the subgroups of Level Switches 208A by delaying a first predetermined time period (e.g., 1 μs) between issuing respective enable control commands EN[0:3]. Each enable control command EN is left "on" for second predetermined time period (e.g., 5 μs) before being turned "off." In one embodiment, the enable period is longer than the delay period so that there is an overlap in the enable signals, meaning that even though the Level Switches 208A are sequentially enabled, there are times when some or all of the them are enabled.

Figure 7:
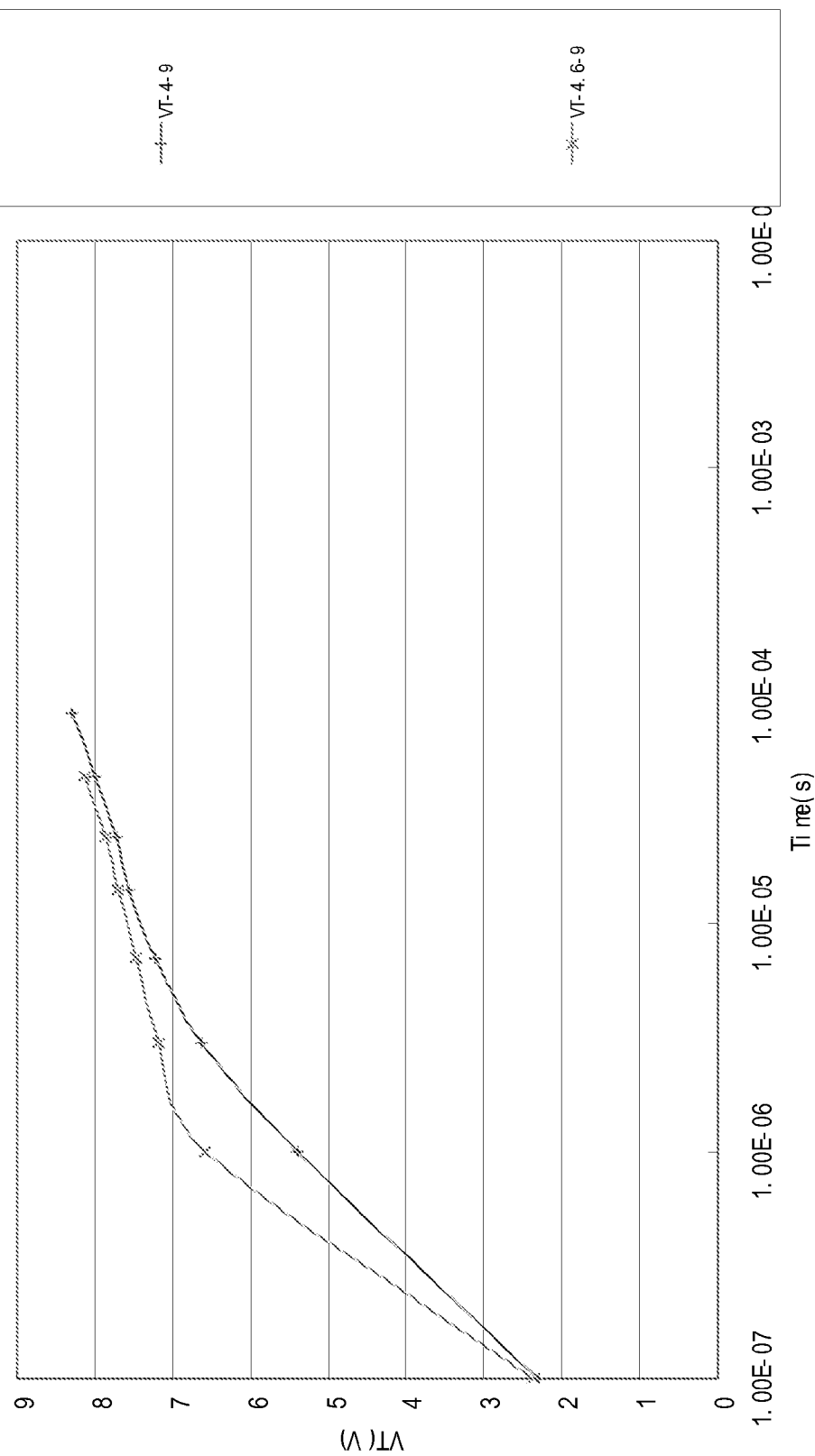
FIG. 7 is a graph showing the threshold voltage of programmed cells versus time.

Though the illustrated programming operation has some timing penalties in that it extends the time for programming a word unit from, for example, 5 µs to 8 µs, the demands on the regulated power supply are greatly reduced. FIG. 7 shows the measured cell threshold value (VT) of a cell versus programming time characteristics. Generally, FIG. 7 shows that most current is drawn at the beginning of programming of a cell. The x-axis is the programming time. The Y-axis is the resulted threshold voltage (VT) of the programmed cell when the drain node bias voltage of the cells is (i) 4V and (ii) 4.6V and when the control gate (e.g, word line) voltage is 9V. With the programming, the VT is increased and thus the programming current is reduced. As can be seen from the graph, the greatest programming current demands occur within about the first 1.0 µs, and more specifically within the first 0.5 µs of cell programming and then taper thereafter. Therefore, by staggering (i.e., time shifting) the beginning of the program operation for the various subgroups, the current requirements can be reduced at the beginning of each programming operation for a given subgroup when compared to commencing programming of the entire group of cells at the same time. The sequential I/O programming reduces the demand on the pumping circuit capabilities by distributing the programming operation in time This, in turn, eases the design requirements on the pumping circuit and even allows the pumping circuit strength to be reduced, since the selected cells are programmed to a higher threshold voltage sequentially. For example, the pumping capability can be reduced to about 75% or less of the pumping capability required for non-sequential programming operation. In this embodiment, the maximum programming current occurs in the timing interval from t3 to t5. During this time, the word unit's 16 IOs are programmed, but the first 12 IOs have already been under programming operation for some period of time and thus the required current is reduced to about two-thirds or a half of that needed in the prior art.

The design is also less susceptible or immune to bit line leakage current induced by over-erased cells since the number of cells selected for programming is reduced, at least for part of the programming period.

Figure 5:
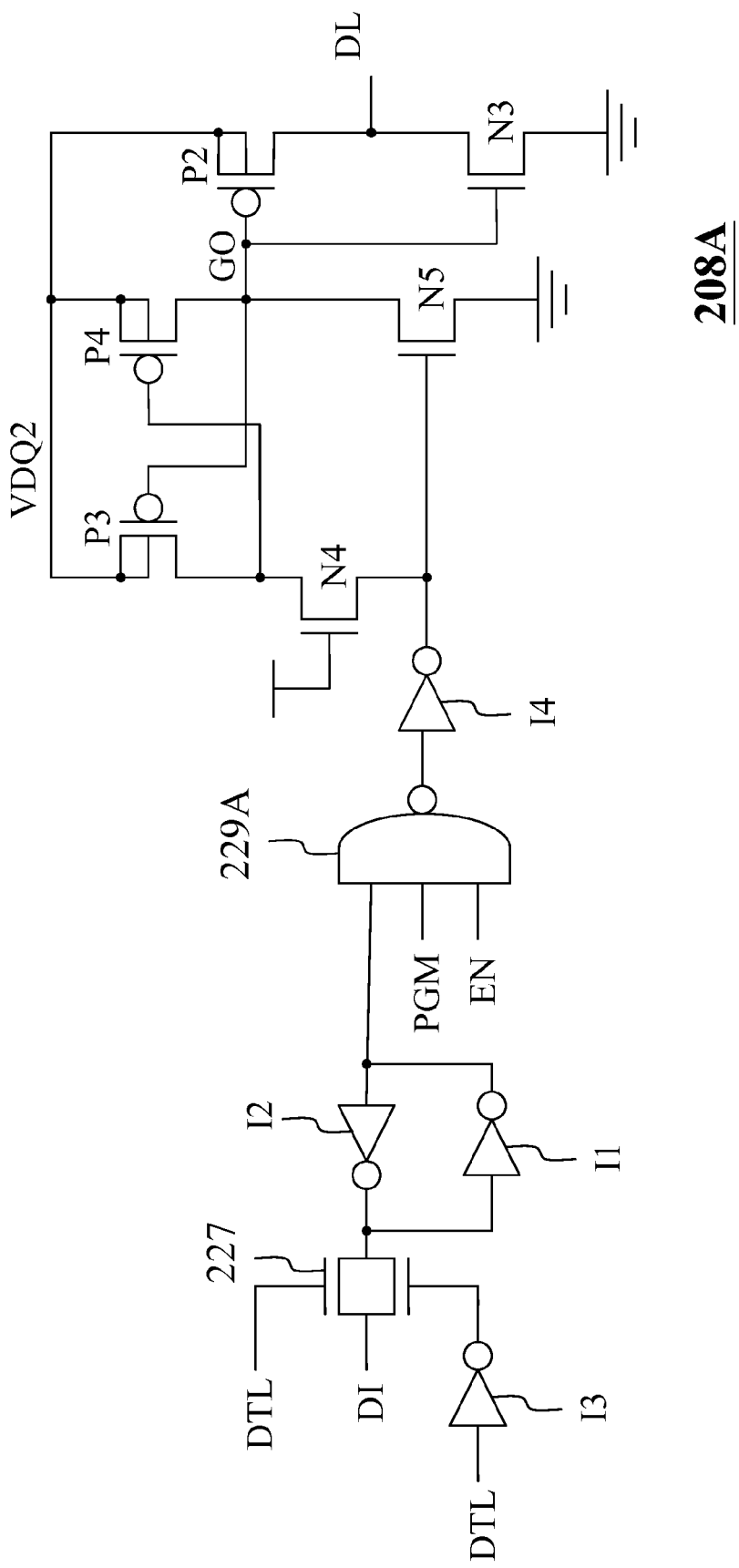
FIG. 5 is a circuit diagram of an embodiment of a data level switch portion of the programming circuit of FIG. 4.

FIG. 5 is a more detailed view of a DI to DL Level Switch 208A according to one embodiment of the present invention. The Level Switch 208A is identical to the Level Switch 208 shown in FIG. 3 and described above, and like reference numerals identify like components, except for NAND gate 229A. In comparison to NAND gate 229 of FIG. 3, NAND gate 229A has a third input for receiving a respective enable control signal EN. The data DI is passed to the data line DL only during that portion of the program period (note PGM is high for the entire program period (e.g., 8 µs)) when the respective enable control signal EN for the subgroup of I/O is high (e.g., for the 5 µs window of the programming period assigned to the subgroup of I/O in which respective DI to DL Level Switch 208A is included). The remaining operation of the DI to DL Level Switch circuit 208A shown in FIG. 5 is as described above in connection with FIG. 3.

Though described principally in connection with programming NOR flash memory cells, the sequential programming method and circuit described herein may also be used to sequentially program NAND flash cells if the programming current is intended to be reduced.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of programming a group of memory cells in a semiconductor memory device, said device comprising a memory array including a plurality of memory cells coupled to a plurality of addressable word lines and a plurality of addressable bit lines, wherein said bit lines are selectively coupled to a common voltage node for being biased by a bit line programming voltage, said method comprising the steps of:
   selecting said group of memory cells for programming;
   enabling a first subgroup of memory cells from said group of memory cells for programming;
   after enabling said first subgroup, waiting a first predetermined time period; and
   after said first predetermined time period, enabling a second subgroup of memory cells from said group of memory cells for programming while continuing to enable said first subgroup for programming.

2. The method of claim 1, further comprising the step of programming memory cells within an enabled subgroup, said programming step comprising selectively coupling memory cells within said enabled subgroup to said common voltage node dependent on data to be programmed to said memory cells.

3. The method of claim 1, wherein said first and second subgroups are enabled for a second predetermined time period, said second predetermined time period being longer than said first predetermined time period.

4. The method of claim 1, further comprising the step of after said second subgroup is enabled, disabling said first subgroup, wherein said first and second subgroups are both enabled for an overlapping period of time.

5. The method of claim 1, further comprising the steps of:
   providing said bit line voltage for programming said group of memory cells to said common voltage node; and
   performing a program operation on said subgroups when enabled.

6. The method of claim 1, wherein said group of memory cells is a word unit and said first and second subgroups are half-byte units.

7. The method of claim 6, further comprising the steps of:
   after enabling said second subgroup, waiting said first predetermined time period and enabling a third subgroup of memory cells from said group of memory cells for programming while continuing to enable said second subgroup for programming; and
   after enabling said third subgroup, waiting said first predetermined time period and enabling a fourth subgroup of memory cells from said group of memory cells for programming while continuing to enable said third subgroup for programming, wherein said third and fourth subgroups are half-byte units.

8. The method of claim 1, further comprising generating said bit line programming voltage with a regulated power supply comprising a charge pump.

9. The method of claim 1, wherein said memory cells are flash memory cells.

10. A program circuit for a semiconductor memory device, said semiconductor memory device comprising a memory array including a plurality of memory cells coupled to a plurality of addressable word lines and a plurality of addressable bit lines, wherein said bit lines are selectively coupled to a common voltage node for being biased by a bit line programming voltage, said program circuit comprising:

a regulated power supply voltage for providing said bit line programming voltage;

a level switch circuit coupled between said common voltage node and bit lines coupled to a group of memory cells selectable for programming, said level switch circuit configured to enable different subgroups of said memory cells from said group of memory cells for programming in response to an enable control signal; and a control circuit for providing said enable control signal, wherein said enable control signal enables a first one of said subgroups, and after a first predetermined time period enables a second one of said subgroups while continuing to enable said first one of said subgroups.

11. The program circuit of claim 10, wherein said regulated power supply voltage includes a charge pump and a voltage regulator coupled to said charge pump.

12. The program circuit of claim 10, wherein said group of memory cells is a word unit and said first and second subgroups are half-byte units.

13. The program circuit of claim 10, wherein said memory cells are flash memory cells.

14. The program circuit of claim 10, wherein said enable control signal enables said first and second subgroups for a second predetermined time period, said second predetermined time period being longer than said first predetermined time period.

15. The program circuit of claim 10, wherein said enable control signal disables said first subgroup after a second predetermined time period, wherein said first and second subgroups are both enabled for an overlapping period of time.

16. The program circuit of claim 10, wherein said level shift circuit comprises a plurality of individual level shift circuit modules each associated with a respective subgroup of said memory cells.

17. The program circuit of claim 16, wherein each individual level shift circuit module from said plurality of level shift circuit modules operates under control of a program control signal and said enabled control signal.

18. A semiconductor memory device comprising:
a memory array comprising a plurality of flash memory cells coupled to a plurality of addressable word lines and a plurality of addressable bit lines, wherein said memory array is accessed by a plurality of I/Os, each I/O associated with at least one bit line from said plurality of addressable bit lines;

a regulated power supply comprising a charge pump for providing a bit line programming voltage; and an I/O selection circuit for sequentially enabling subgroups of said I/Os for programming during a programming operation under control of an enable control signal, wherein said subgroups are simultaneously enabled for a portion of said programming operation.

19. The semiconductor memory device of claim 18, wherein said subgroups are sequentially enabled in increments corresponding to a first predetermined time period and remain enabled for a second predetermined time period, wherein said second predetermined time period is greater than said first predetermined period of time.

20. The semiconductor memory device of claim 18 wherein said subgroups each include 4 I/Os and programming occurs in word units.

21. A method of programming a semiconductor memory device, said semiconductor memory device including a memory array comprising a plurality of flash memory cells coupled to a plurality of addressable word lines and a plurality of addressable bit lines, wherein said memory array is accessed by a plurality of I/Os, each I/O associated with at least one bit line from said plurality of addressable bit lines, the method comprising the steps of:

providing bit line programming voltage with a regulated power supply, said regulated power supply comprising a charge pump; and sequentially enabling subgroups of said I/Os for programming during a programming operation, wherein at least some of said subgroups are simultaneously enabled for a portion of said programming operation.

22. The method of claim 21, wherein said subgroups are sequentially enabled in increments corresponding to a first predetermined time period and remain enabled for a second predetermined time period, wherein said second predetermined time period is greater than said first predetermined period of time.

* * * * *